(12) United States Patent
Tu et al.

(10) Patent No.: US 8,981,557 B2
(45) Date of Patent: Mar. 17, 2015

(54) METHOD FOR FORMING PHOTOVOLTAIC CELL, AND RESULTING PHOTOVOLTAIC CELL

(71) Applicants: Chih-Chiang Tu, Tauyen (TW); Chun-Lang Chen, Madou Township (TW)

(72) Inventors: Chih-Chiang Tu, Tauyen (TW); Chun-Lang Chen, Madou Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/621,318

(22) Filed: Sep. 17, 2012

(65) Prior Publication Data

US 2013/0019938 A1 Jan. 24, 2013

Related U.S. Application Data

(63) Continuation of application No. 12/827,213, filed on Jun. 30, 2010, now Pat. No. 8,293,645.

(51) Int. Cl.
*H01L 23/48* (2006.01)
*H01L 23/52* (2006.01)
(Continued)

(52) U.S. Cl.
CPC ............... *G03F 7/0002* (2013.01); *B82Y 10/00* (2013.01); *B82Y 40/00* (2013.01);
(Continued)

(58) Field of Classification Search
CPC ................ H01L 31/022425; H01L 31/022433; H01I 31/068

USPC ............... 257/79, 80, 81, 84, 88, 89, 99, 101, 257/102, 103, 431, 734, 690, 618, 622, 257/E27.126, E25.007, E25.009, 624; 438/22, 28, 34, 42, 45, 57, 98, 542, 438/597, 675
See application file for complete search history.

(56) References Cited

U.S. PATENT DOCUMENTS 4,520,552 A * 6/1985 Arnould et al. ............... 438/621
6,058,100 A 5/2000 Mieda et al.
(Continued)

FOREIGN PATENT DOCUMENTS

| CN | 1499289 A | 5/2004 |
| CN | 1253381 A | 5/2005 |
| JP | 2007103572 A | 4/2007 |

OTHER PUBLICATIONS

Chinese Official Action issued Nov. 5, 2012 in counterpart Chinese Patent Application No. 201110022187.1.
(Continued)

*Primary Examiner* — Thanh Y Tran
(74) *Attorney, Agent, or Firm* — Duane Morris LLP

(57) ABSTRACT

A photovoltaic cell manufacturing method is disclosed. Methods include manufacturing a photovoltaic cell having a selective emitter and buried contact (electrode) structure utilizing nanoimprint technology. The methods include providing a semiconductor substrate having a first surface and a second surface opposite the first surface; forming a first doped region in the semiconductor substrate adjacent to the first surface; performing a nanoimprint process and an etching process to form a trench in the semiconductor substrate, the trench extending into the semiconductor substrate from the first surface; forming a second doped region in the semiconductor substrate within the trench, the second doped region having a greater doping concentration than the first doped region; and filling the trench with a conductive material. The nanoimprint process uses a mold to define a location of an electrode line layout.

11 Claims, 10 Drawing Sheets

(51) Int. Cl.
*H01L 29/40* (2006.01)
*G03F 7/00* (2006.01)
*B82Y 10/00* (2011.01)
*B82Y 40/00* (2011.01)
*H01L 31/0224* (2006.01)
*H01L 31/068* (2012.01)
*H01L 31/18* (2006.01)

(52) U.S. Cl.
CPC ..... *H01L 31/022425* (2013.01); *H01L 31/068* (2013.01); *H01L 31/1804* (2013.01); *Y02E 10/52* (2013.01); *Y02E 10/547* (2013.01)
USPC ............. 257/734; 257/690; 257/624; 438/98; 438/675

(56) References Cited

U.S. PATENT DOCUMENTS

| | | | |
|---|---|---|---|
| 7,595,855 | B2 | 9/2009 | Lee et al. |
| 7,888,160 | B2* | 2/2011 | Shen et al. ................ 438/72 |
| 2004/0169003 | A1 | 9/2004 | Lee et al. |
| 2006/0144275 | A1 | 7/2006 | Kolesnychenko et al. |
| 2006/0266409 | A1 | 11/2006 | Takeda et al. |
| 2007/0157965 | A1* | 7/2007 | Park ........................ 136/256 |
| 2008/0050564 | A1 | 2/2008 | Fujikawa et al. |
| 2008/0105303 | A1 | 5/2008 | Oswald et al. |
| 2009/0215224 | A1 | 8/2009 | Li et al. |
| 2009/0231714 | A1 | 9/2009 | Zhao et al. |
| 2009/0308440 | A1 | 12/2009 | Adibi et al. |
| 2010/0037952 | A1* | 2/2010 | Lin ........................... 136/256 |
| 2010/0126577 | A1 | 5/2010 | Wu et al. |
| 2010/0243040 | A1 | 9/2010 | Kim |
| 2011/0081745 | A1* | 4/2011 | Wu et al. .................... 438/98 |
| 2011/0197965 | A1* | 8/2011 | Finarov et al. ........... 136/256 |

OTHER PUBLICATIONS

Gao, L.J., "Recent Progress in Nanoimprint Technology and its Applications", Institute of Physics Publishing, Journal of Physics D: Applied Physics, 2004, 37(11) R-123-141, doi:10,1088/0022-3727/37/11/R01, IOP Publishing Ltd., Printed in the UK.

Gao, L.J., "Nanoimprint Lithography: Methods and Material Requirements", Advanced Materials, 19, 2007, Wiley-VCH Verlag GmbH & Co., KGaA, Weinheim, pp. 495-513.

Chopra, K.L. et al., "Thin-film Solar Cells: An Overview," Progress in Photovoltaics: Research and Applications, Prog. Photovolt: Res. Appl., 2004, 12:69-92 (DOI: 10.1002/pip.541), Dec. 16, 2003.

Official Action issued Aug. 7, 2012 in counterpart Korean Patent Application No. 10-2011-0063186 with English translation.

* cited by examiner

METHOD FOR FORMING PHOTOVOLTAIC CELL, AND RESULTING PHOTOVOLTAIC CELL

This application is a continuation of U.S. application Ser. No. 12/827,213, filed Jun. 30, 2010, which application is expressly incorporated by reference herein in its entirety.

TECHNICAL FIELD

The present disclosure relates generally to photovoltaic cells, and more particularly, to a photovoltaic cell manufacturing.

BACKGROUND

Photovoltaic cells (also referred to as solar cells) convert light energy into electricity. Photovoltaic cells and manufacturing thereof are continually evolving to provide higher conversion efficiency. For example, buried contact solar cells, which include a contact formed within a groove of the substrate, have been introduced to provide high efficiency. Selective emitter regions are often formed in the substrate within the groove to further enhance conversion efficiency. Conventional methods for forming the buried contact (electrode)/selective emitter structure include laser scribing, mechanical machining, screen printing, etching, photolithography, or combination thereof. Though laser scribing/mechanical machining provides some control over defining dimensions and locations of the selective emitter/buried contact structure, it has been observed that this process can result in substrate surface damage, which can affect the photovoltaic device throughout. Further, a depth of the selective emitter/buried contact structure is not easily controlled by the laser scribing/mechanical machining. The screen printing method presents difficulty in defining smaller pattern features, sometimes exhibits low accuracy, and easily results in incomplete (or broken) buried contact lines. The etching process is difficult to define the pattern (dimension/location) of the electrode line without implementing a photolithography process. Though photolithography processes can define the buried contact (electrode) line with high accuracy and the dimension/location of the electrode pattern is easily controlled, photolithography is expensive and provides less than desirable throughput. Further, conventional methods, such as those described above, are limited at providing mass production capability of photovoltaic cells. Accordingly, although existing methods have been generally adequate for their intended purposes, they have not been entirely satisfactory in all respects.

SUMMARY

The present disclosure provides for many different embodiments. According to one of the broader forms of embodiments of the present invention, a method includes: providing a semiconductor substrate having a first surface and a second surface opposite the first surface; forming a first doped region in the semiconductor substrate adjacent to the first surface; performing a nanoimprint process and an etching process to form a trench in the semiconductor substrate, the trench extending into the semiconductor substrate from the first surface; forming a second doped region in the semiconductor substrate within the trench, the second doped region having a greater doping concentration than the first doped region; and filling the trench with a conductive material.

In another one of the broader forms of embodiments of the present invention, a method includes: providing a semiconductor substrate having a textured surface; providing a mold having a designable pattern feature, the designable pattern feature defining a location of an electrode line; forming a resist layer over the semiconductor substrate; pressing the mold having the designable pattern feature into the resist layer; removing the mold from the resist layer, wherein a patterned resist layer remains, the patterned resist layer having an opening that exposes the semiconductor substrate; etching the exposed semiconductor substrate within the opening, thereby forming a trench in the semiconductor substrate, the trench extending into the semiconductor substrate from the textured surface; forming a doped region in the semiconductor substrate within the trench; and filling the trench with a conductive material, thereby forming the electrode line.

Yet another one of the broader forms of embodiments of the present invention involves a method. The method includes: providing a semiconductor substrate; forming a trench in the semiconductor substrate; forming a selective emitter region in the semiconductor substrate within the trench; and filling the trench with a conductive material, thereby forming a buried contact. The trench is formed by a nanoimprint and etching process. The nanoimprint process exposes a portion of the semiconductor substrate, and the etching process is performed on the exposed portion of the semiconductor substrate, thereby forming the trench in the semiconductor substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
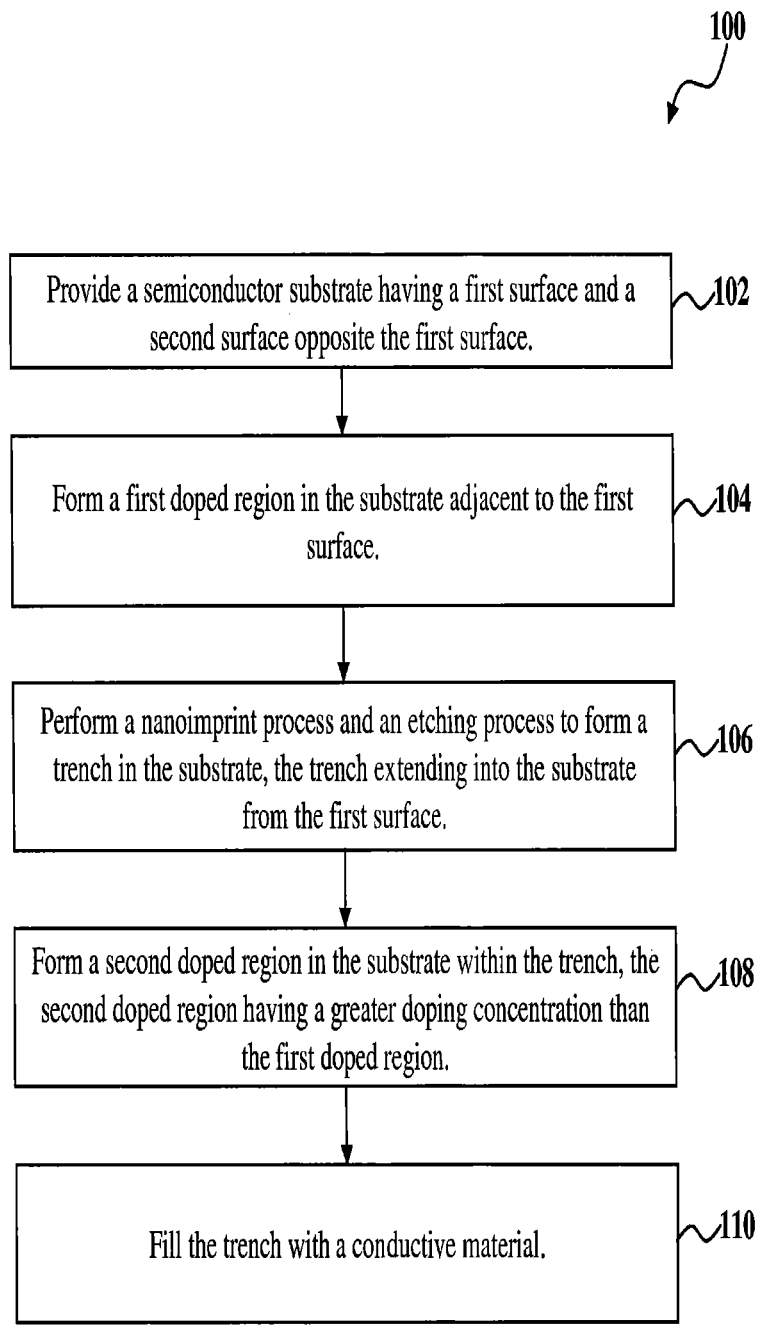
FIG. 1 is a flow chart of a method for fabricating a photovoltaic device according to various embodiments of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.)

are used for ease of the present disclosure of one features relationship to another feature. The spatially relative terms are intended to cover different orientations of the device including the features.

FIG. 1 is a flow chart of an embodiment of a method 100 for fabricating a photovoltaic device. As will be discussed further below, the method 100 is utilized to form a photovoltaic cell having a selective emitter and buried contact structure. The method 100 begins at block 102 where a semiconductor substrate having a first surface and a second surface opposite the first surface is provided. At block 104, a first doped region is formed in the semiconductor substrate adjacent to the surface. At block 106, a trench is formed in the substrate utilizing nanoimprint technology and an etching process. The trench extends from the first surface into the substrate. According to various embodiments, the nanoimprint technology utilizes thermal nanoimprinting lithography techniques (including thermoplastic and thermal-curable nanoimprinting), direct imprinting techniques (also referred to as embossing), UV nanoimprinting lithography (UV-NIL) techniques (also referred to as UV-curable nanoimprinting), or combinations thereof. Alternatively, the nanoimprint technology utilizes other nanoimprinting lithography (NIL) techniques known in the art, including any future-developed NIL lithography techniques, and combinations thereof. The NIL process is performed in a suitable environment, such as a vacuum environment or an air environment. The NIL process further utilizes various alignment techniques. The etching process is a dry etching process, wet etching process, other suitable etching process, or combination thereof. At blocks 108 and 110, a second doped region is formed in the substrate within the trench, and the trench is filled with a conductive material. Additional steps can be provided before, during, and after the method 100, and some of the steps described can be replaced or eliminated for additional embodiments of the method. The discussion that follows illustrates various embodiments of a photovoltaic device that can be fabricated according to the method 100 of FIG. 1.

FIGS. 2-10 are diagrammatic sectional side views of a photovoltaic device 200 (also referred to as a solar cell), in portion or entirety, at various stages of fabrication according to the method of FIG. 1. The photovoltaic device 200 is a buried contact solar cell. FIGS. 2-10 have been simplified for the sake of clarity to better explain the inventive concepts of the present disclosure. Additional features not shown can be added in the photovoltaic device 200, and some of the features described below can be replaced or eliminated in other embodiments of the photovoltaic device 200.

Figure 2:
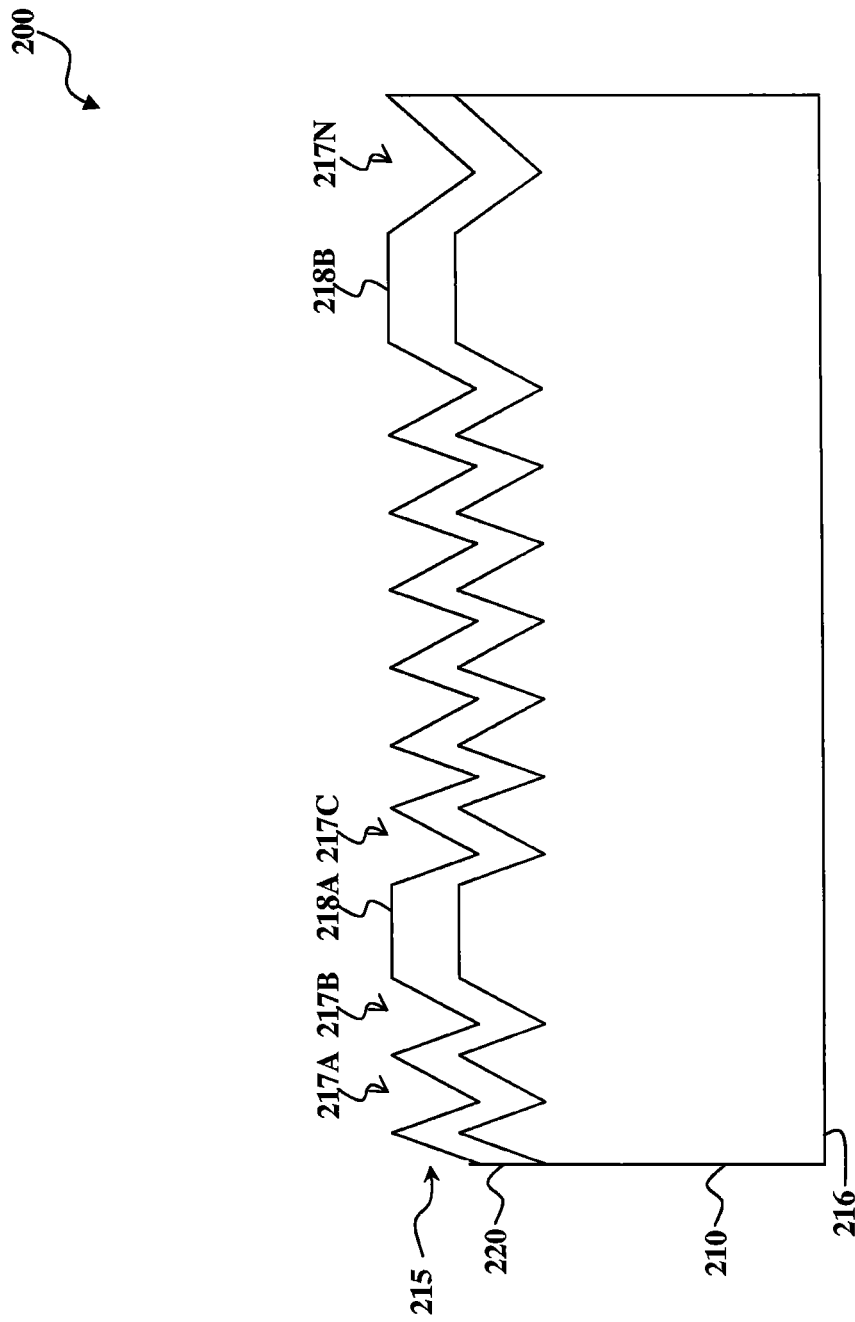
FIGS. 2-10 are diagrammatic sectional side views of a photovoltaic device at various fabrication stages according to the method of FIG. 1.

In FIG. 2, a substrate 210 is provided. The substrate 210 is any substrate suitable for photovoltaic devices. In the depicted embodiment, the substrate 210 is a semiconductor substrate comprising silicon. The silicon substrate may be a single crystalline, multi-crystalline, polycrystalline, or amorphous silicon. Alternatively, the substrate 210 may be another elementary semiconductor (i.e., germanium); a compound semiconductor (i.e., silicon carbide, gallium arsenic, gallium phosphide, indium phosphide, indium arsenide, and/or indium antimonide); an alloy semiconductor (i.e., SiGe, GaAsP, AlInAs, AlGaAs, GaInAs, GaInP, and/or GaInAsP); or combinations thereof. The substrate 210 can have any suitable crystallographic orientation (e.g., a (100), (110), or (111) crystallographic orientation). In the depicted embodiment, the substrate 210 is a p-doped silicon substrate. Common p-type dopants include boron, gallium, indium, or combinations thereof. Because the photovoltaic device 200 is a photovoltaic device having a p-doped substrate, doping configurations described below should be read to be consistent with a p-doped substrate. The photovoltaic device 200 may alternatively include an n-doped substrate, in which case, the doping configurations described below should be read to be consistent with an n-doped substrate (i.e., read with doping configurations having an opposite conductivity).

The substrate 210 includes a textured surface 215 and a non-textured, flat surface 216. In the depicted embodiment, the textured surface 215 may be referred to as a top surface, or a first surface, of the substrate 210, and the non-textured, flat surface 216 may be referred to as a bottom surface, or second surface, of the substrate 210. The textured surface 215 includes various openings 217A, 217B, 217C, . . . 217N, within the front surface of the substrate 210. FIG. 2 shows portions 218A and 218B of the textured surface 215 that are flat portions of the top surface and substantially parallel with the back surface 216 of the substrate 210. In the depicted embodiment, the portions 218A and 218B are flat, uninterrupted (not interrupted by openings) areas of the top surface of the substrate 210, from which contact areas of the photovoltaic device 200 will be formed. The contact areas of the photovoltaic device 200 may be formed in areas of the textured surface 215 that do not include flat portions, such as portions 218A and 218B. The textured surface 215 is formed by a suitable process, such as a nanoimprint lithography and etching technique. Alternatively, the textured surface 215 may be formed by other known methods, such as wet etching, dry etching, laser scribing, mechanical machining, or combinations thereof.

The substrate 210 includes a doped region 220. In the depicted embodiment, the doped region 220 is an n-doped region formed within a portion of the substrate 210 that forms the textured surface 215. The doped region 220 is adjacent to the textured surface 215 of the substrate 210. In the depicted embodiment, the p-doped silicon substrate 210 and n-doped region 220 form a p-n junction. The n-doped region 220 may be referred to as an emitter layer. The n-doped region 220 includes an n-type dopant, such as phosphorous, arsenic, antimony, lithium, other suitable n-type dopant, or combinations thereof. The n-doped region 220 is formed by a thermal diffusion process, an ion implantation process, or other suitable processes.

A location and dimension of a selective emitter and buried contact structure are now defined within the substrate. For example, a trench (also referred to as a groove, cavity, or opening) is formed within the substrate to define the location and dimension of the selective emitter/buried contact structure, alternatively referred to as an electrode line. Portions of the substrate within the trench are then doped to form the selective emitter structure, and the trench is filled with a conductive material to form the buried contact structure (electrode). Conventional approaches to form the trench utilize laser and/or mechanical scribing/machining, screen printing, etching, photolithography, or combinations thereof. Laser or mechanical scribing/machining provides some control over defining the dimensions and locations of the selective emitter/buried contact structure, but can damage the substrate surface. Further, a depth of the trench is not easily controlled by the laser or mechanical scribing/machining Screen printing methods sometimes exhibit low accuracy, and can result in incomplete (or broken) trench lines. Smaller pattern features are difficult to define using screen printing methods. For an etching process, the pattern (dimension/location) of the electrode line is difficult to define without using photolithography. Though photolithography processes can define the electrode line with high accuracy and the dimension/location of the electrode pattern is easily controlled, photolithography is expensive and slow. Because of the above issues, these approaches present great difficulties in mass production of photovoltaic cells.

Accordingly, referring to FIGS. 3-10, the present disclosure uses nanoimprint technology to form the selective emitter/buried contact structure of the photovoltaic device 200. Nanoimprint technology can easily define the dimension and location of the electrode line pattern (selective emitter/buried contact structure pattern) for any feature size with high accuracy. Utilizing nanoimprint technology is less expensive and provides higher throughput than the conventional approaches described above, while still achieving characteristics (for example, accuracy and depth control) similar to photolithography processes. Accordingly, efficient, cost-effective mass production of photovoltaic devices is possible, specifically for manufacturing selective emitter/buried contact photovoltaic devices.

Figure 3:
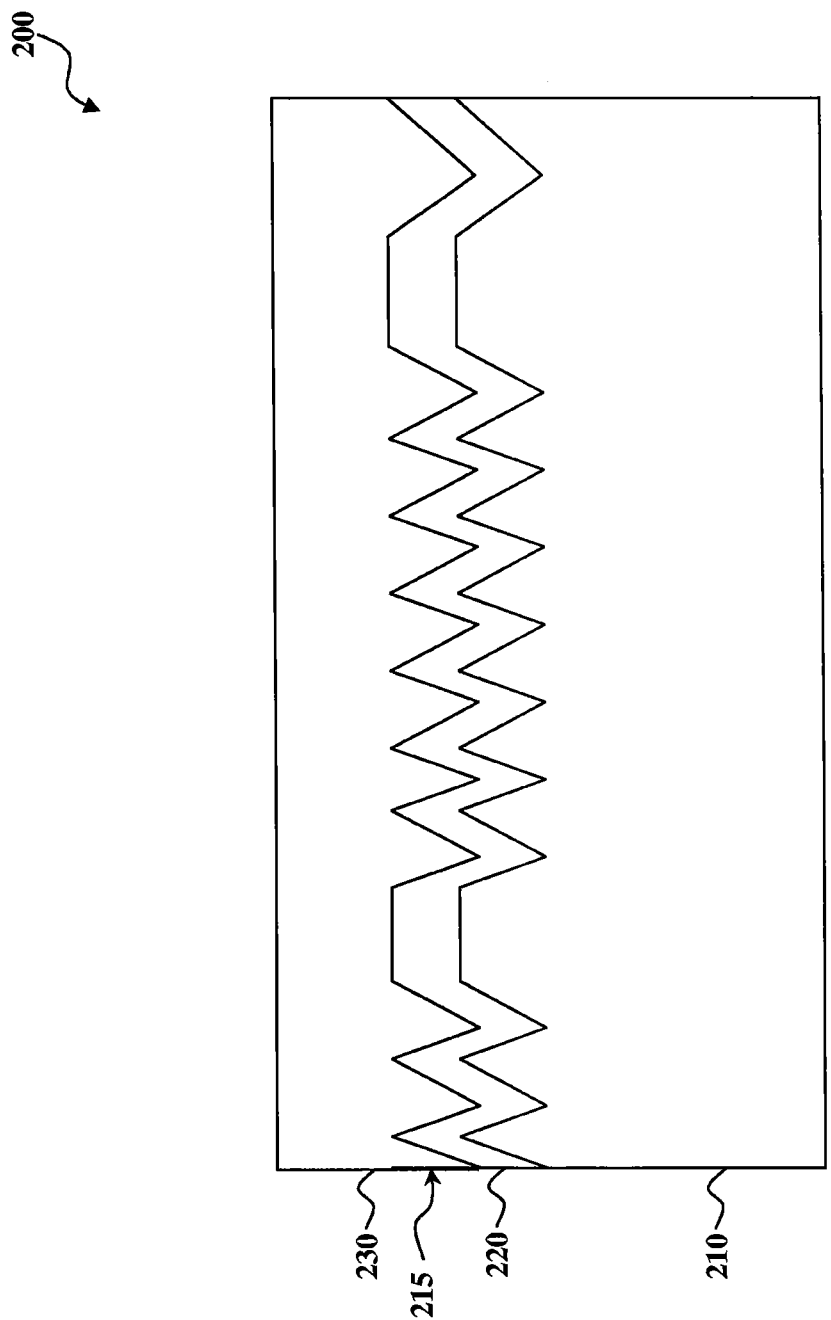

Referring to FIG. 3, a material layer 230 (also referred to as an intermedium or shielding layer) is formed over the substrate 210 (specifically over the textured surface 215 of the substrate 210) by a spin coating, flat scrubbing, or other suitable process. A cleaning process, such as an RCA clean, may be performed prior to forming the material layer 230, to remove contaminants from the textured surface 215 of the substrate 210. The material layer 230 is a resist layer. The resist layer is a homopolymer resist, such as PMMA (polymethylmethacrylate) or PS (polystyrene); thermal plastic resist; UV-curable resist; resist including siloxane copolymers, such as PDMS (poly(dimethyl siloxane))-organic block or graft copolymers; thermally curable liquid resist; UV-curable liquid resist (for room temperature nanoimprinting, for example); other suitable resist known in the art; future-developed resist; or combinations thereof. The resist layer may be formed by an oxide metal particle dispersion to solution. The material layer 230 may comprise a multi-layer structure. The material layer 230 is has a suitable thickness, for example, from about a few hundred angstroms (Å) to about several micrometers (µm). In the depicted embodiment, the material layer 230 has a thickness of about 1,000 Å.

Figure 4:
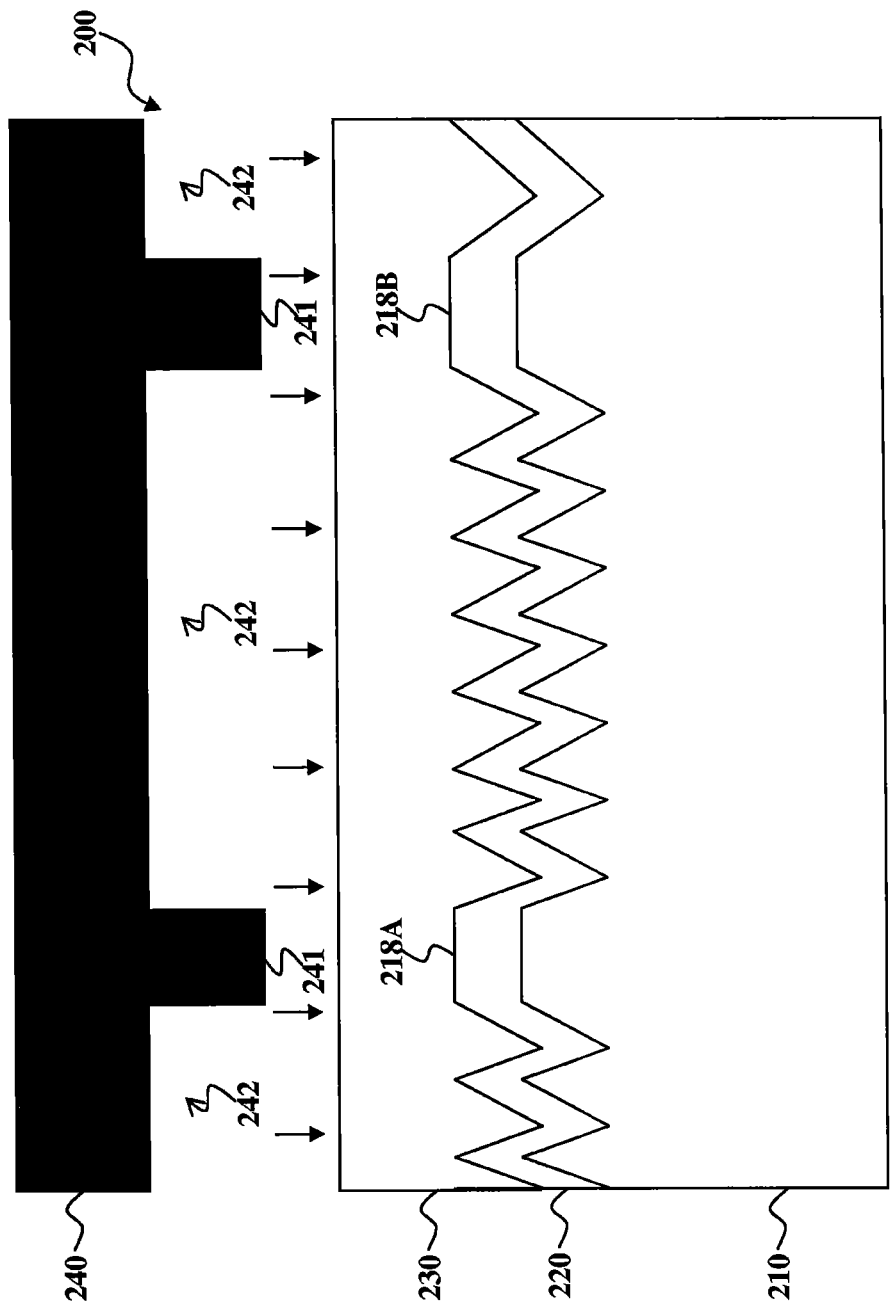
Figure 5:
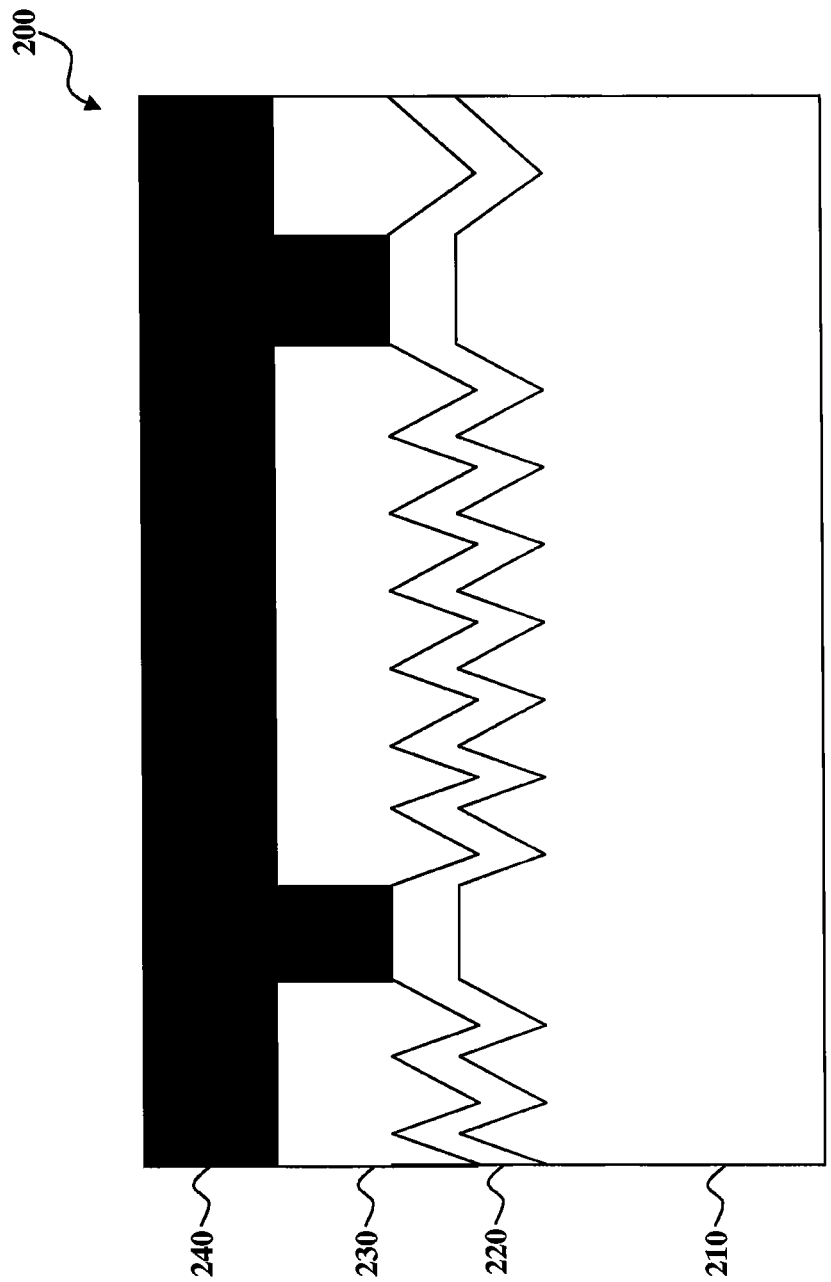
Figure 6:
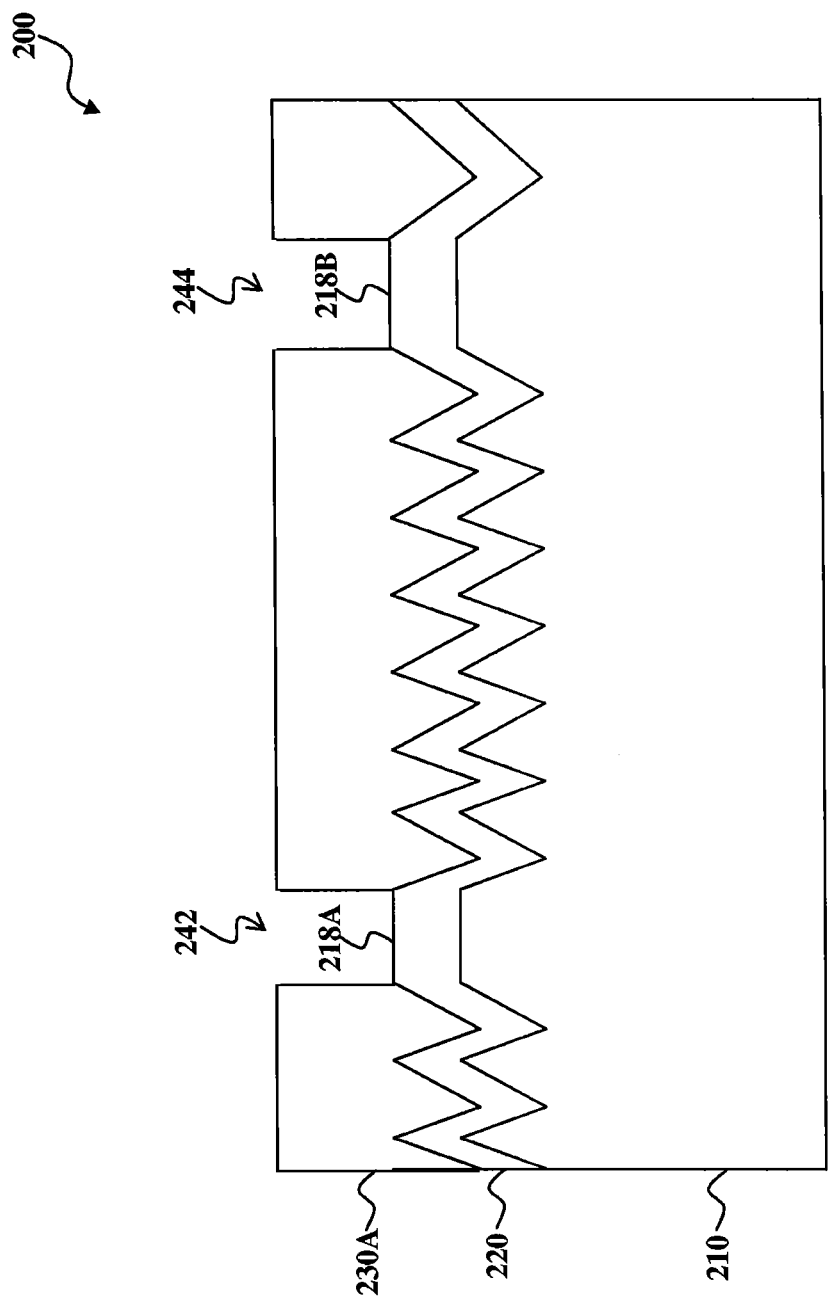

Referring to FIGS. 4-6, a mold 240 is pressed into the material layer 230 and removed, thereby imprinting the material layer 230 with a predetermined pattern. The mold 240 is made of a suitable material, such as quartz ($SiO_2$), silicon, SiC, silicon nitride, metal, sapphire, diamond, resin, other suitable mold material known in the art, future-developed mold material, or combinations thereof. In an example, the mold 240 may be quartz having a patterned metal layer, such as chromium (Cr), forming the predetermined pattern. In another example, the mold 240 may be quartz having a patterned MoSi layer forming the predetermined pattern. The mold 240 includes protrusion features 241 and openings 242 (also referred to as trenches or cavities) that form the predetermined pattern. The predetermined pattern is any suitable design, and thus, the protrusion features 241 and openings 242 may have various shapes and designs depending on a particular pattern or feature desired. In the depicted embodiment, the predetermined pattern of the mold 240 defines the positions and dimensions of the electrode lines, or contact lines. Further, in the depicted embodiment, the protrusions 241 of the mold 240 align with the contact areas, portions 218A and 218B of the textured surface 215 of the substrate 210. As noted above, the textured surface 215 may not have flat portions, such as portions 218A and 218B. In this situation, the protrusions 241 may still be aligned with contact areas of the photovoltaic device 200, which are areas of the substrate 210 designated as contact areas.

As noted above, the mold 240 is pressed into the material layer 230 (FIGS. 4 and 5) at a suitable temperature and pressure, thereby creating a thickness contrast in the material layer 230. More specifically, the predetermined pattern of the mold 240 is transferred to the material layer 230 because the material layer 230 underneath the protrusion features 241 is displaced and transported to the trenches or cavities 242 of the mold 240 (FIG. 5). The temperature and pressure is selected based on properties of the mold 240 and material layer 230, and the imprinting is performed in a vacuum or in air. The material layer 230 is cured and set so that the material layer 230 hardens and assumes its displaced shape. This ensures that the material layer 230 will not flow back into the spaces created by the displacement when the mold 240 is removed. For example, where the material layer 230 is a thermal resist, the temperature may be raised higher than its glass transition temperature so that the material layer 230 changes to a liquid state, such that it is displaced and transported into the trenches or cavities 242 of the mold 240. Once the material layer 230 conforms to the pattern of the mold 240, the temperature may be brought below the material layer's glass transition temperature to solidify the material layer 230. In another example, where the material layer 230 is a thermal or UV curable material, the material layer 230 may initially be in a liquid state, such that it conforms to the mold 240 when pressed into the material layer 230, and then, solidifies when cured by a thermal curing, UV curing, or combination thereof. Other curing and setting processes may be used.

When the mold 240 is removed, a patterned material layer 230A remains as illustrated in FIG. 6. In the depicted embodiment, the patterned material layer 230A includes a pattern for the selective emitter/buried contact structure. Openings 242 and 244 expose portions of the substrate 210, particularly portions of the top surface of the substrate 210. The exposed portions define a location of the selective emitter/buried contact structure (electrode lines), specifically the contact areas 218A and 218B of the photovoltaic device 200. The patterned material layer 230A shields the other portions of the substrate 212 from subsequent processing (such as an etching process). A thin residual layer of the material layer 230 may remain over the exposed portions of the substrate 210.

Figure 7:
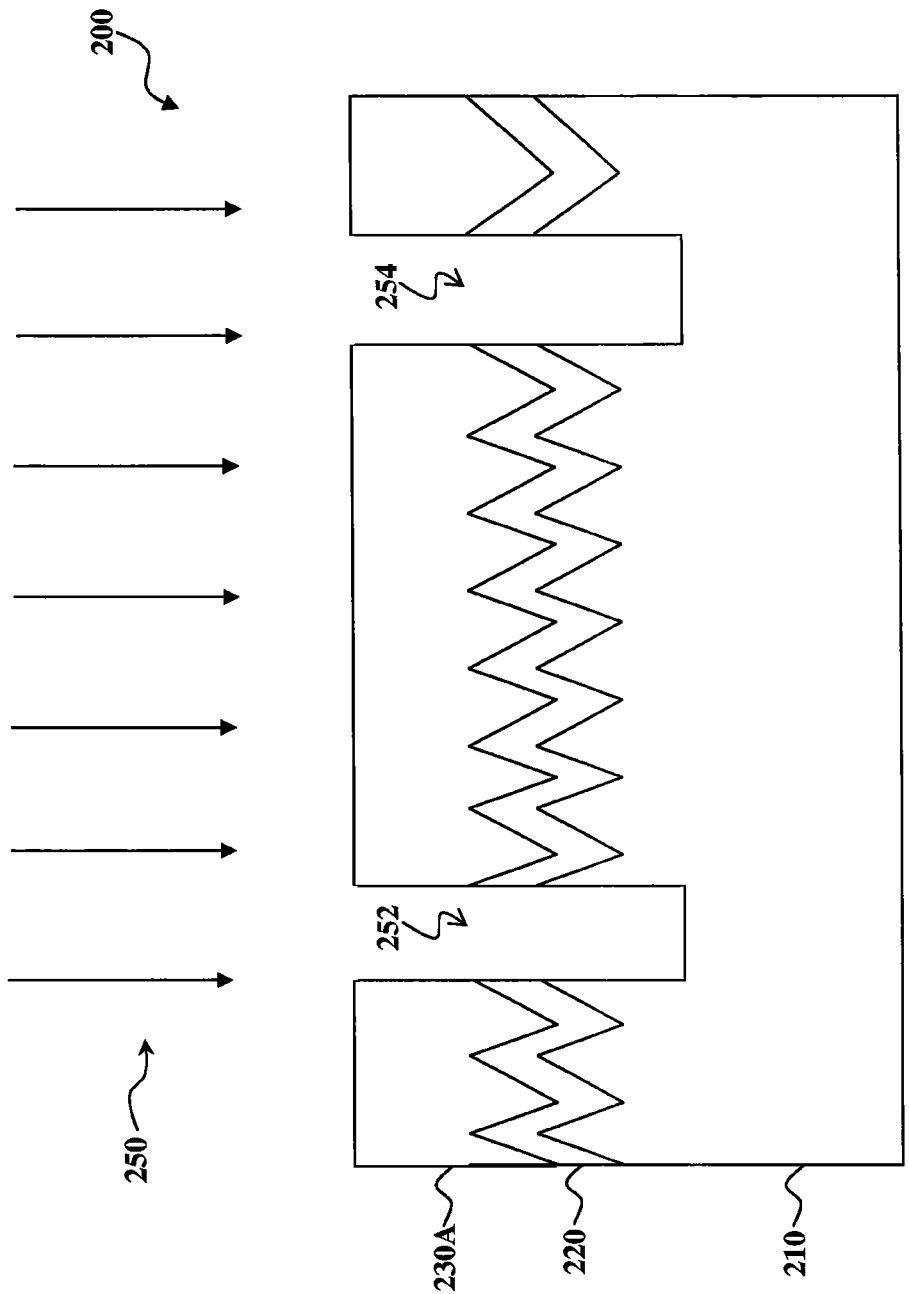

In FIG. 7, an etching process 250 is performed on the substrate 210. Particularly, the exposed portions of the substrate 210, portions 218A and 218B of the textured surface 215, are etched while other areas are protected by patterned material layer 230A. The etching process 250 may be a dry etching process, a wet etching process, other suitable etching process, or combinations thereof. In the depicted embodiment, the etching process 250 is a dry etching process. An exemplary dry etching process is a plasma etching process that utilizes $SF_6$, $CF_4$, $Cl_2$, or combinations thereof. Other dry etching processes known in the art may be utilized, including future-developed dry etching processes. Alternatively, the etching process 250 is a wet etching process. An exemplary etching solution for the wet etching process is HF (hydrofluoric acid). Other wet etching processes known in the art may be utilized, including future-developed wet etching processes. In situations where a thin residual layer of the material layer 230 remains over the exposed portions of the substrate 210, the etching process 250 removes the residual layer, or a dry etching process, such as a reactive ion etching (RIE) process, may be utilized to remove the residual layer prior to performing the etching process 250.

The etching process 250 extends the openings 242 and 244 in the patterned material layer 230A into the substrate 210, forming trenches 252 and 254 (also referred to as grooves, openings, or cavities). The trenches 252 and 254 extend from the textured surface 215 of the substrate 210 (specifically the doped region 220 of the substrate 210) into the substrate 210. The selective emitter and buried contact are formed in the trenches 252 and 254. In the depicted embodiment, portions of the semiconductor substrate 210 define a bottom of the trenches 252 and 254, and portions of the semiconductor substrate 210 and doped region 220 define sidewalls of the trenches 252 and 254. The trenches 252 and 254 include any suitable shape and dimension depending on design requirements of the photovoltaic device 200.

Figure 8:
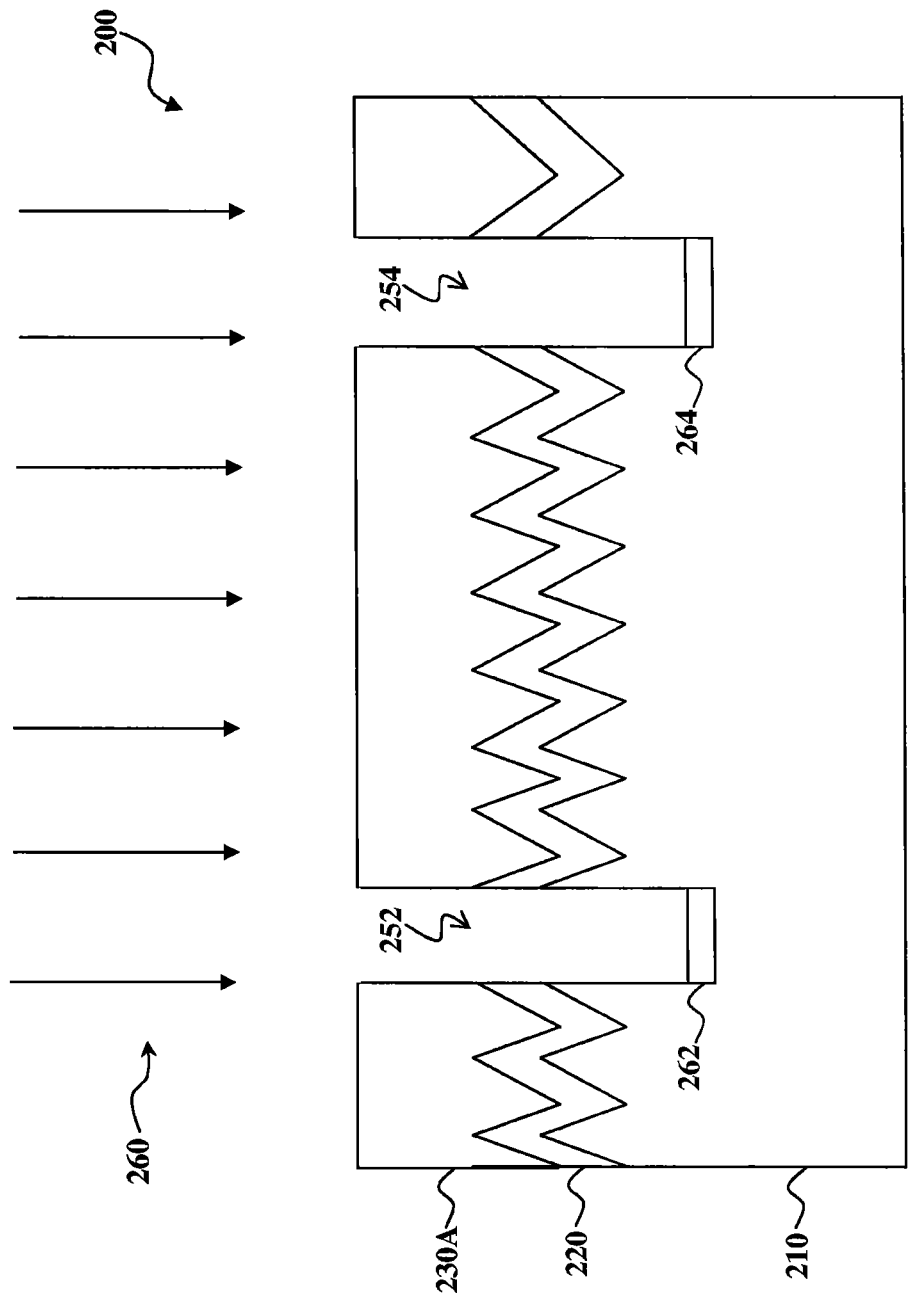
Figure 9:
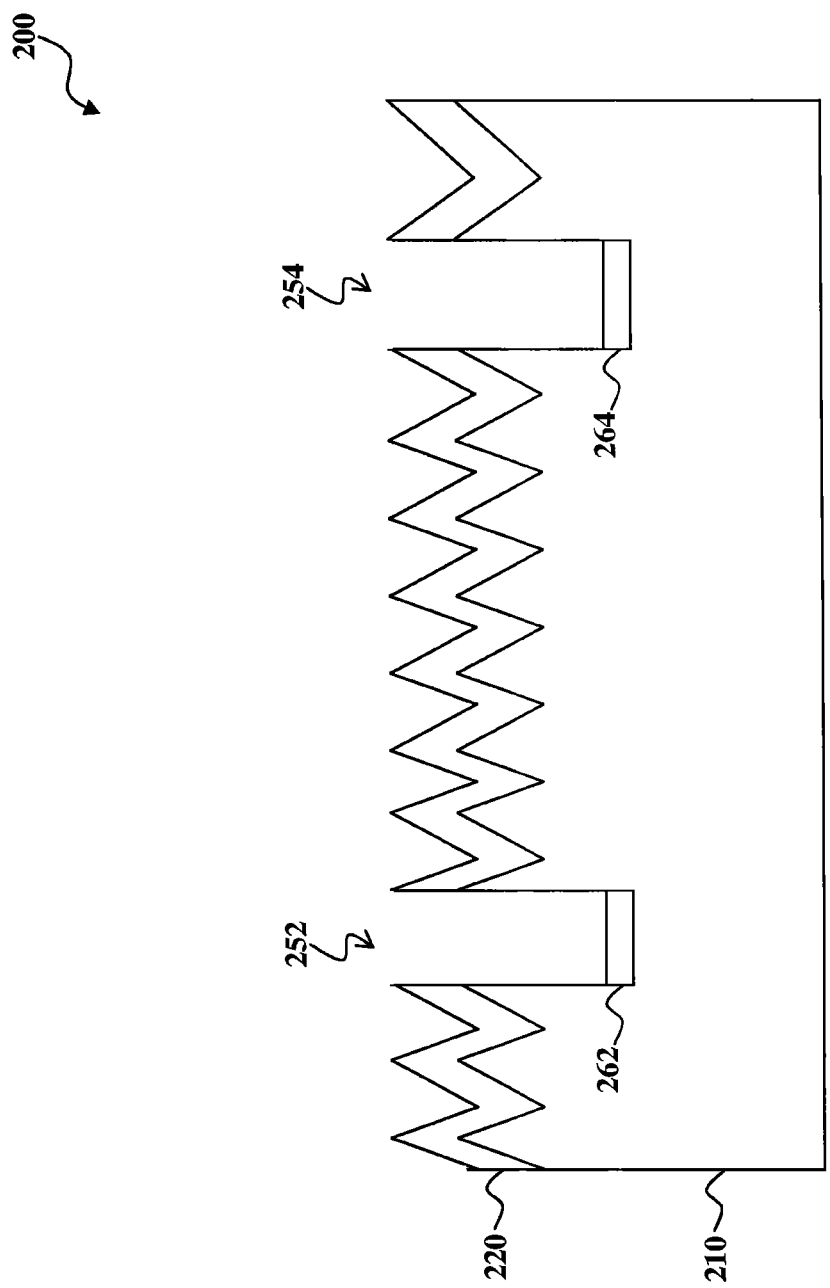

In FIG. 8, dopants 260 are added to form doped regions 262 and 264 in the substrate 210 within the trenches 252 and 254. The doped regions 262 and 264 form selective emitter regions of the photovoltaic device 200. In the depicted embodiment, the doped regions 262 and 264 are formed in the portions of the substrate 210 that define the bottom of the trenches 252 and 254. The doped regions 262 and 264 may be formed in the portions of the substrate that define sidewalls of the trenches 252 and 254. In the depicted embodiment, the doped regions 262 and 264 include a same type of dopant as the doped region 220, and thus, the doped regions 262 and 264 are n-doped regions. The n-doped region 220 is formed by adding an n-type dopant to the portions of the substrate 210 that define the bottom of the trenches 252 and 254. The n-type dopant may be phosphorous, arsenic, antimony, lithium, other suitable n-type dopant, or combinations thereof. Alternatively, the doped regions 262 and 264 could include a different type dopant than the doped region 220, such as a p-type dopant. The doped regions 262 and 264 include a greater doping concentration than the doped region 220. For example, the doped regions 262 and 264 are n+-doped regions (or double n-doped regions), and the doped region 220 is an n-doped region.

In the depicted embodiment, the dopants 260 are added by a thermal diffusion process. Alternatively, an ion implantation process is used. In yet another alternative, a combination thermal diffusion and ion implantation process is implemented to form doped regions 262 and 264. The patterned material layer 230A acts as a shield during the dopants 260 being added to portions of the substrate 210, protecting the doped region 220 of the substrate 210 from the dopants 260. It is noted that the dopants 260 may be added to the patterned material layer 230A while acting as a shield. Thereafter, in FIG. 9, the patterned shielding layer 230A is removed by a suitable process, such as a stripping process, leaving trenches 252 and 254. For example, the patterned material layer 230A may be removed by a solution including sulfuric acid ($H_2SO_4$) and hydrogen peroxide ($H_2O_2$). Alternatively, other solutions known in the art, including future-developed solutions, are used for to remove the patterned material layer 230A.

Figure 10:
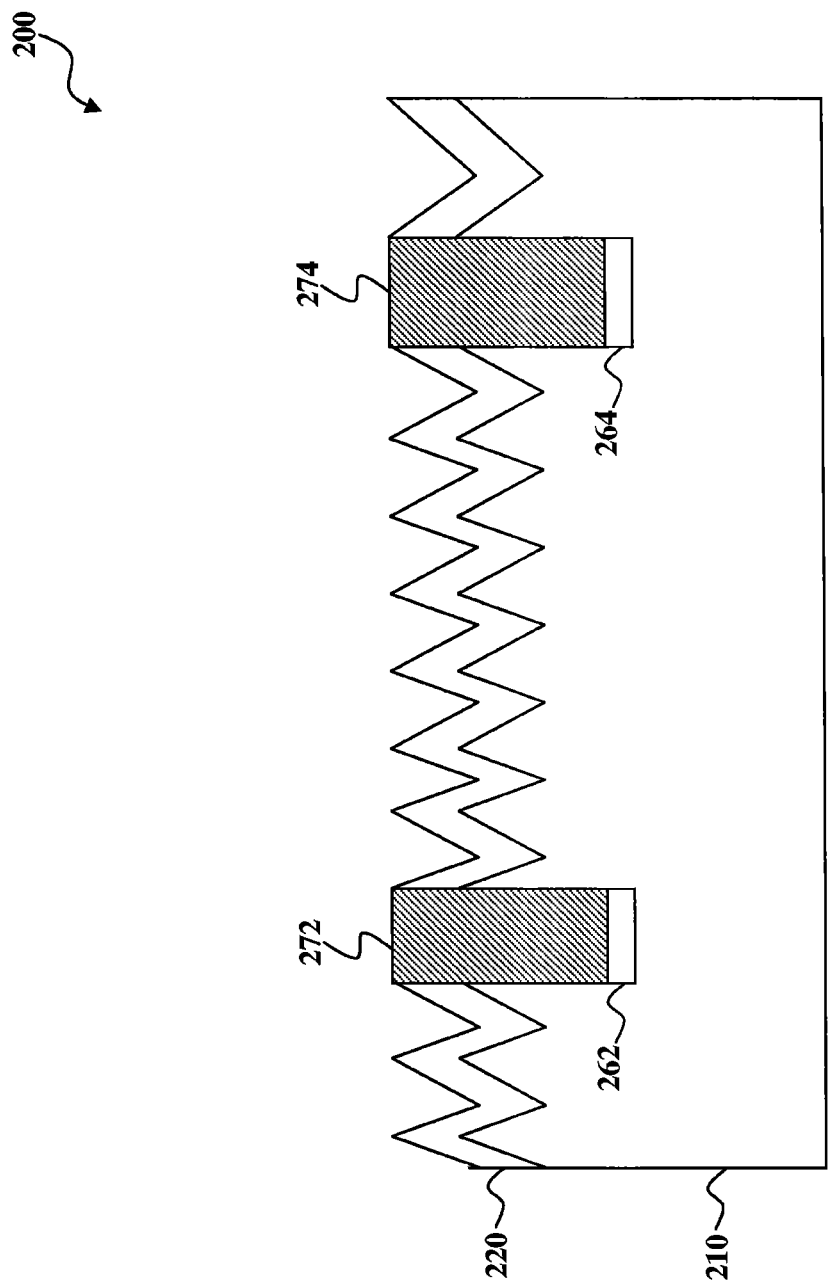

In FIG. 10, trenches 252 and 254 in the substrate 210 are filled with a conductive material to form buried contacts 272 and 274 (also referred to as metal fingers). Exemplary conductive material include copper (Cu), gold (Au), aluminum (Al), titanium (Ti), tungsten (W), nickel (Ni), chromium (Cr), molybdenum (Mo), lead (Pb), palladium (Pd), silver (Ag), tin (Sn), platinum (Pt), transparent conducting oxide material, other suitable conductive material, metal alloys thereof, metal silicides thereof, or combinations thereof. The buried contacts 272 and 274 may comprise a multi-layer structure. In the depicted embodiment, the buried contacts 272 and 274 are formed by a screen printing process known in the art, including future-developed screen printing processes. Alternatively, the buried contacts 272 and 274 are formed by other suitable processes known in the art. Additional features may be formed, such as a contact formed on the bottom (or back) surface 216 of the substrate 210. In an example, another doped region is formed in the substrate 210, for example, adjacent to the bottom surface 216. An electrode may also be formed on the bottom surface 216 of the substrate 210. The electrode may be a conductive material, such as copper or aluminum. The electrode may be formed adjacent to the doped region along the bottom surface 216.

The disclosed photovoltaic cell process results in photovoltaic cells having a high conversion efficiency that is an improvement over photovoltaic cells manufactured using conventional methods. A photovoltaic cell manufactured using the disclosed processes can exhibit greater than 20% conversion efficiency, compared to 16% to 17% conversion efficiency for photovoltaic cells manufactured by conventional methods. It has been observed that the disclosed photovoltaic device can achieve increased electron-hole pairs. Also, as discussed above, the disclosed photovoltaic cell manufacturing process uses nanoimprinting technology for defining a location of an electrode line (in the depicted embodiment, a location of a buried contact/selective emitter structure). This provides easily definable dimensions and locations of the electrode line pattern for any feature size with high accuracy. Further, nanoimprint technology achieves photolithography characteristics without having to use photolithography processes, significantly reducing production costs. Accordingly, the disclosed photovoltaic cell manufacturing process provides efficient, cost-effective mass production of photovoltaic cells, specifically of selective emitter/buried contact photovoltaic devices. It is understood that different embodiments may have different advantages, and that no particular advantage is necessarily required of any one embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photovoltaic cell comprising:
   a semiconductor substrate having a first surface, a second surface opposite the first surface, and a trench in the semiconductor substrate, the trench extending into the semiconductor substrate from the first surface but not penetrating completely through the semiconductor substrate to the second surface;
   an emitter adjacent to the first surface in the semiconductor substrate;
   a selective emitter within the trench; and
   a buried contact disposed inside and filling the volume of the trench over the selective emitter,
   wherein the emitter and the selective emitter are separate from each other, and the buried contact connects the emitter and the selective emitter.

2. The photovoltaic cell of claim 1 wherein the first surface of the semiconductor substrate is textured.

3. The photovoltaic cell of claim 2 wherein the buried contact has a flat front surface, substantially parallel with the second surface of the semiconductor substrate.

4. The photovoltaic cell of claim 1 wherein:
the semiconductor substrate is a p-doped substrate;
the emitter is an n-doped region; and
the selective emitter is an n+-doped region.

5. The photovoltaic cell of claim 1 wherein the emitter is in the semiconductor substrate and is formed by doping a portion of the semiconductor substrate adjacent to the first surface of the semiconductor substrate.

6. The photovoltaic cell of claim 1 wherein the selective emitter is in the semiconductor substrate and is formed by doping a portion of the semiconductor substrate defining a side wall or the bottom of the trench.

7. The photovoltaic cell of claim 1 wherein the buried contact comprises a multilayer structure comprising one or more metallic materials.

8. The photovoltaic cell of claim 1 wherein the selective emitter has a greater doping concentration than the emitter.

9. The photovoltaic cell of claim 1 wherein the emitter is a first doped region, and the selective emitter is a second doped region.

10. The photovoltaic cell of claim 1 wherein the buried contact is a conductive material region.

11. The photovoltaic cell of claim 1 wherein the buried contact is a metal electrode.

\* \* \* \* \*